United States Patent
Wong et al.

(10) Patent No.: US 6,683,372 B1
(45) Date of Patent: Jan. 27, 2004

(54) MEMORY EXPANSION MODULE WITH STACKED MEMORY PACKAGES AND A SERIAL STORAGE UNIT

(75) Inventors: Tayung Wong, Fremont, CA (US); John Carrillo, San Jose, CA (US); Jay Robinson, Sunnyvale, CA (US); Clement Fang, Cupertino, CA (US); David Jeffrey, Santa Cruz, CA (US); Nikhil Vaidya, Mountain View, CA (US); Nagaraj Mitty, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/442,850

(22) Filed: Nov. 18, 1999

(51) Int. Cl.[7] .............................................. H01L 23/00
(52) U.S. Cl. ......................... 257/686; 257/723; 257/777
(58) Field of Search ................................ 257/685, 686, 257/723, 724, 777, 778; 365/51, 52, 63; 361/748, 760, 783

(56) References Cited

U.S. PATENT DOCUMENTS

| | | | |
|---|---|---|---|
| 4,884,237 A | * 11/1989 | Mueller et al. | 365/63 |
| 5,332,922 A | * 7/1994 | Oguchi et al. | 257/723 |
| 5,513,135 A | * 4/1996 | Dell et al. | 365/52 |
| 5,532,954 A | 7/1996 | Bechtolsheim et al. | 365/52 |
| 5,631,193 A | * 5/1997 | Burns | 29/827 |
| 5,661,677 A | 8/1997 | Rondeau, II et al. | 365/63 |
| 5,804,874 A | * 9/1998 | An et al. | 257/676 |
| 5,811,877 A | * 9/1998 | Miyano et al. | 257/706 |
| 5,828,125 A | * 10/1998 | Burns | 257/668 |
| 5,831,890 A | * 11/1998 | Selna et al. | 365/51 |
| 5,867,448 A | * 2/1999 | Mann | 365/233 |
| 5,910,685 A | * 6/1999 | Watanabe et al. | 257/777 |
| 5,956,233 A | * 9/1999 | Yew et al. | 361/760 |
| 6,252,299 B1 | 6/2001 | Masuda et al. | 257/686 |
| 6,314,013 B1 | 11/2001 | Ahn et al. | 365/63 |
| 6,324,071 B2 | 11/2001 | Weber et al. | 361/785 |

FOREIGN PATENT DOCUMENTS

| | | |
|---|---|---|
| EP | 0744748 A2 | 11/1996 |
| EP | 0813204 A2 | 12/1997 |

OTHER PUBLICATIONS

Intel, PC SDRAM Serial Presence Detect (SPD) Specification, Rev. 1.2A, Dec. 1997, pp. 1–6 & 11.*
International Search Report, application No. PCT/US00/31439, filed Nov. 15, 2000.

* cited by examiner

*Primary Examiner*—David L. Robertson
(74) *Attorney, Agent, or Firm*—Meyertons Hood Kivlin Kowert & Goetzel, P.C.; B. Noël Kivlin

(57) ABSTRACT

A memory expansion module with stacked memory packages. A memory module is implemented using stacked memory packages. Each of the stacked memory packages contains multiple memory chips, typically DRAMs (dynamic random access memory). The memory may be organized into multiple banks, wherein a given memory chip within a stacked memory package is part of one bank, while another memory chip in the same package is part of another bank. The memory module also includes a clock driver chip and a storage unit. The storage unit is configured to store module identification information, such as a serial number. The storage unit is also configured to store information correlating electrical contact pads on the module with individual signal pins on the stacked memory packages. This may allow an error to be quickly traced to a specific pin on a stacked memory package when an error is detected on the memory bus by an error correction subsystem.

21 Claims, 9 Drawing Sheets

| Connector Pad | 1 | 2 | 3 | 4 | 5 | 6 |
|---|---|---|---|---|---|---|
| IC and Pin # | U1.5 | U1.6 | U1.7 | U1.8 | U1.9 | U1.10 |

| Connector Pad | 7 | 8 | 9 | 10 | 11 | 12 |
|---|---|---|---|---|---|---|
| IC and Pin # | U2.15 | U2.16 | U2.17 | U2.18 | U2.19 | U2.20 |

| Connector Pad | 13 | 14 | 15 | 16 | 17 | 18 |
|---|---|---|---|---|---|---|
| IC and Pin # | U4.2 | U4.3 | U4.4 | U4.5 | U4.6 | U4.7 |

*Fig. 8*

MEMORY EXPANSION MODULE WITH STACKED MEMORY PACKAGES AND A SERIAL STORAGE UNIT

BACKGROUND OF THE INVENTION

1. Field of the Invention

This invention generally relates to memory hardware for computer systems, and more specifically to memory expansion modules for expanding memory in computer systems.

2. Description of the Related Art

Many modern computer systems allow for memory expansion by way of single inline memory modules (SIMMs) and/or dual inline memory modules (DIMMs). SIMMs and DIMMs include small, compact circuit boards that are designed to mount easily into an expansion socket mounted on another circuit board, typically a computer motherboard. The circuit boards used to implement SIMMs and DIMMs include an edge connector comprising a plurality of contact pads, with contact pads typically being present on both sides of the circuit board. On SIMMs, opposing contact pads are connected together (i.e. shorted), and thus carry the same signal, while at least some opposing contact pads on DIMMs are not connected, thus allowing different signals to be carried. Due to this, higher signal density may be accommodated by DIMMs.

Memory elements of SIMMs and DIMMs are typically Dynamic Random Access Memory (DRAM) chips. DRAM chips store information as a charge on a capacitor, with the charge level representing a logic one or logic zero. Since a capacitor charge will dissipate over time, DRAM chips require refresh cycles on a periodic basis.

To access a location in a DRAM, an address must first be applied to the address inputs. This address is then decoded, and data from the given address is accessed. In modern DRAMs, rows and columns are addressed separately using row address strobe (RAS) and column address strobe (CAS) control signals. By using RAS and CAS signals, row and column addresses can be time-multiplexed on common signal lines, contact pads, and pins of the address bus. This allows a greater number of memory locations that can be addressed without a corresponding increase in the number of required signal lines, contact pads, and pins.

To address a memory location in a DRAM as described above, a RAS signal is asserted on the RAS input of the DRAM, and a row address is forwarded to row decode logic on a memory chip. The contents of all locations in the addressed row will then be sent to a column decoder, which is typically a combination multiplexer/demultiplexer. After row addressing is complete, a CAS signal is asserted, and a column address is sent to the column decoder. The multiplexer in the column decoder will then select the corresponding column from the addressed row, and the data from that specific row/column address is placed on the data bus for used by the computer system.

The demand for more memory in computer systems is ever increasing. Advances in software has further driven the demand for greater memory capacity, as complex programs require more memory space with which to operate. Along with the demand for greater memory capacity is the need for greater reliability in computer system operation. As the capacity of memory modules increases so to does the possibility of an error or a failure. Tracking errors to their source on a memory module may sometimes be a difficult and time-consuming process. Tracing a signal from a contact on an edge connector to a specific pin on a memory device may be time consuming even when accurate schematics are available. Furthermore, manually tracing a signal from an edge connector contact to a pin on a memory device may be prone to human error.

SUMMARY OF THE INVENTION

The problems outlined above may in large part be solved by a memory expansion module in accordance with the present invention. In one embodiment, a memory module s includes a printed circuit board with a connector edge adapted for insertion in an expansion socket of a computer system. Mounted upon the circuit board is a plurality of stacked memory packages. Each stacked memory chip package contains multiple memory chips, or die, within the package. These memory chips are typically Dynamic Random Access Memory (DRAM). In one embodiment, each stacked memory package includes two DRAM die. The printed circuit board of this embodiment includes 18 locations for mounting the stacked memory packages, resulting in a memory module with a total of 36 memory die. Also mounted upon the printed circuit board is at least one buffer (or line driver) chip for driving address and control signals to the plurality of memory die contained within the stacked memory packages. A clock driver chip is also mounted upon the printed circuit board for driving clock signals to the memory chips. Also mounted on the printed circuit board is a storage unit, which provides module identification and signal routing information. In one embodiment, a serial electrically erasable programmable read-only memory (SEEPROM) is used to implement the storage unit. Information which correlates individual contact pads of the edge connector to individual pins of the stacked memory packages may be stored in the storage unit. Using this information, an error detected by in the memory module may be quickly traced to a specific pin of a stacked memory package.

Each memory die within each stacked memory package may be individually accessed by a computer system. Since the memory die within the stacked memory packages may be accessed individually, multiple memory banks may be formed with each die within a given package belonging to a different memory bank. In one embodiment, each memory die is a 32M×8, resulting in a stacked memory package with a capacity of 64M×8. In general, the memory module is scalable and may be implemented with various amounts of memory capacity.

Thus, in various embodiments, the memory expansion module with stacked memory packages and error correction functionality may advantageously allow greater memory capacity. The use of stacked memory packages may allow for greater memory capacity without the need for additional circuit board area. The use of stacked memory packages with no more than two memory die each may advantageously reduce power consumption and thermal output by the memory module.

BRIEF DESCRIPTION OF THE DRAWINGS

Other objects and advantages of the invention will become apparent upon reading the following detailed description and upon reference to the accompanying drawings in which.

Figure 1:
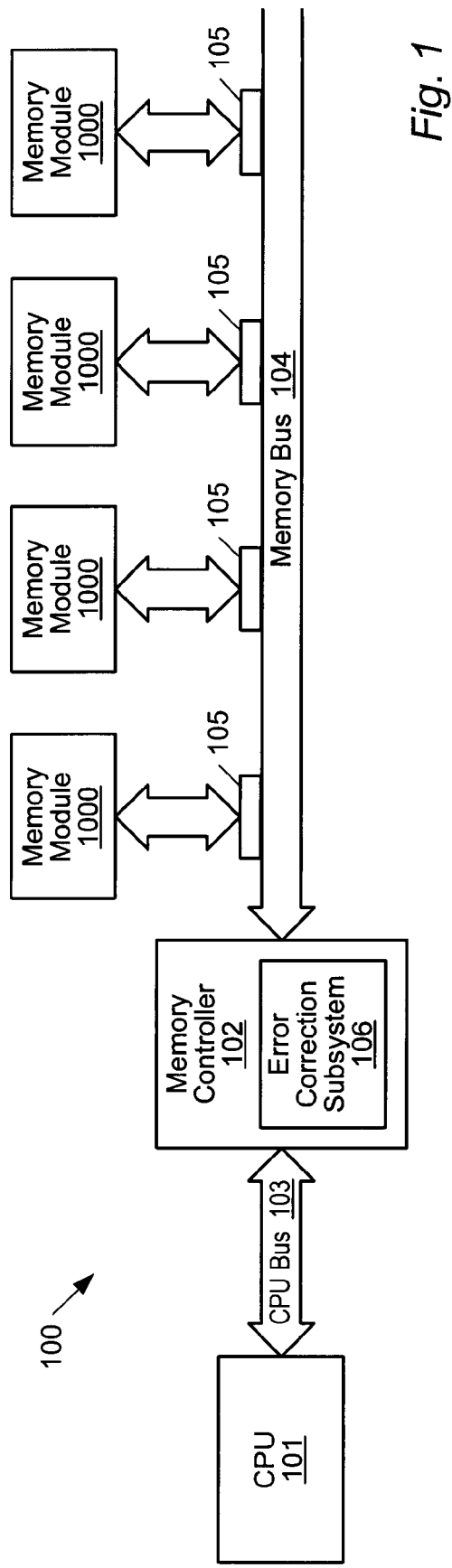
FIG. 1 is a block diagram illustrating an embodiment of a computer system having a CPU, a memory controller, a CPU bus, and a plurality of memory modules.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined be the appended claims.

DETAILED DESCRIPTION OF THE INVENTION

Referring now to FIG. 1, an embodiment of a computer system 100 including a plurality of memory modules 1000, as will be described below, is shown. The computer system includes a CPU 101, coupled to a memory controller 102 through a CPU bus 103. Memory controller 102 is configured to control communications and data transfers between CPU 101 and memory modules 1000.

Memory controller 102 is coupled to each of the memory modules 1000 through a memory bus 104. Memory bus 104 includes a plurality of signal lines, each of which is associated with a single data bit position. The width of memory bus 104 may be any number of bits; typical bus widths include 16 bits, 32 bits, 64 bits, and 128 bits. Some embodiments of memory bus 104 may include extra signal lines for bits that may be used by error correction circuitry. The bits conveyed by the extra signal lines are typically referred to as check bits. For example, one embodiment of a memory bus may be configured to convey 128 data bits and 16 check bits, for a total bus width of 144 bits. Error detection and correction is performed by error correction subsystem 106, located within memory controller 102.

In the embodiment shown, the memory modules are provided to expand main memory of computer system 100, and are electrically coupled to memory bus 104 through a set of expansion sockets 105. An expansion socket 105 of the embodiment shown is configured to receive an edge connector of a printed circuit board of a memory module 1000.

Figure 2:
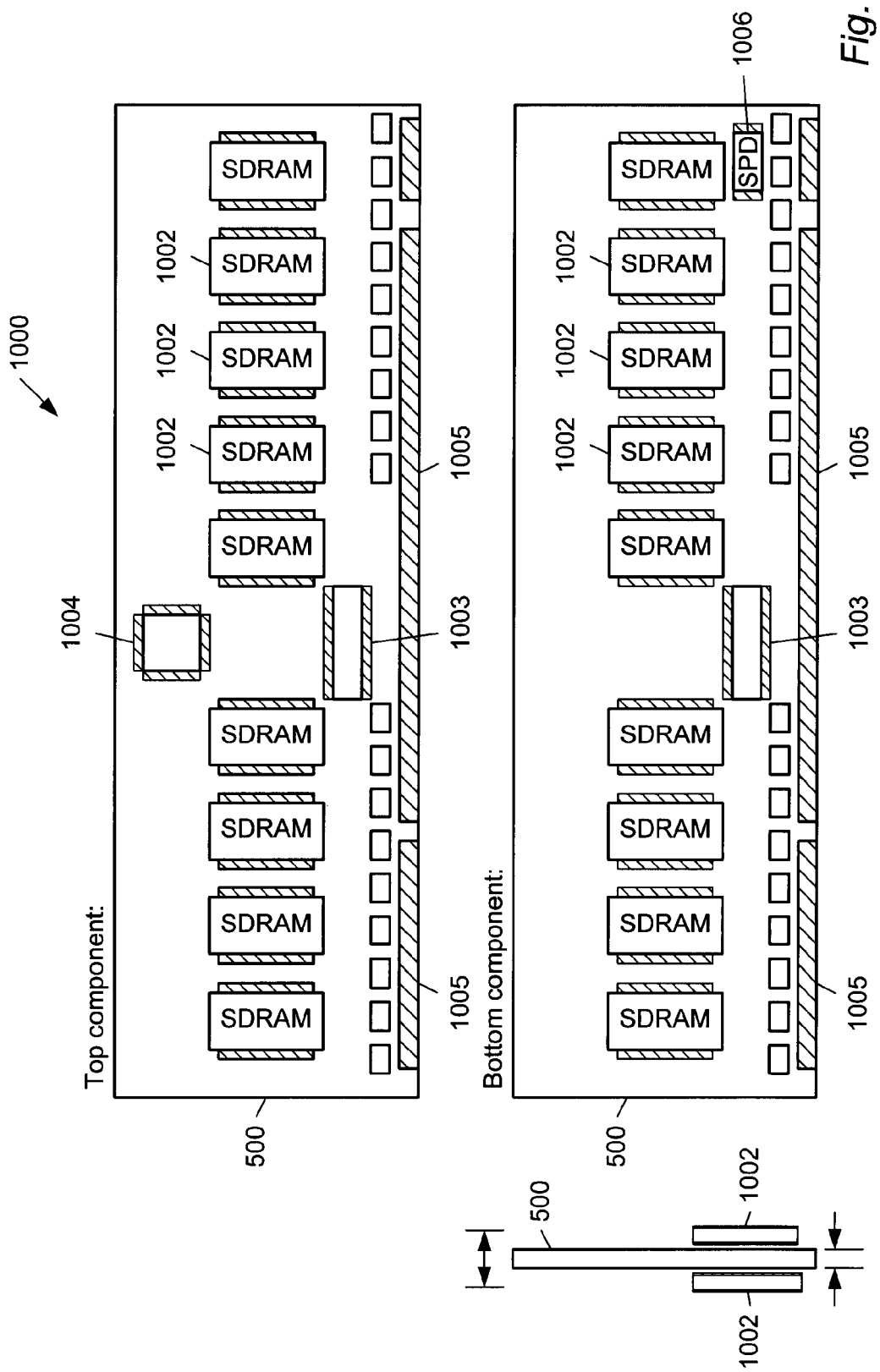
FIG. 2 is a mechanical drawing of one embodiment of a memory module.

Moving on to FIG. 2, a mechanical drawing of one embodiment of the memory module is shown. Memory module 1000 includes a plurality of stacked memory packages 1002 mounted upon both sides of a printed circuit board 500. Memory module 1000 also includes two line driver chips 1003, one mounted on each side of the printed circuit board. In this embodiment, clock driver chip 1004 is mounted on the top side of printed circuit board 500, while a storage unit 1006 is mounted on the bottom side. Edge connector 1005 provides electrical contact between the various components of the module and the computer system 100 of FIG. 1. In the embodiment shown, edge connector 1005 includes 232 electrical contacts. Furthermore, a majority of opposing electrical contacts of edge connector 1005 are not electrically connected, making this module a DIMM (dual inline memory module).

Figure 3A:
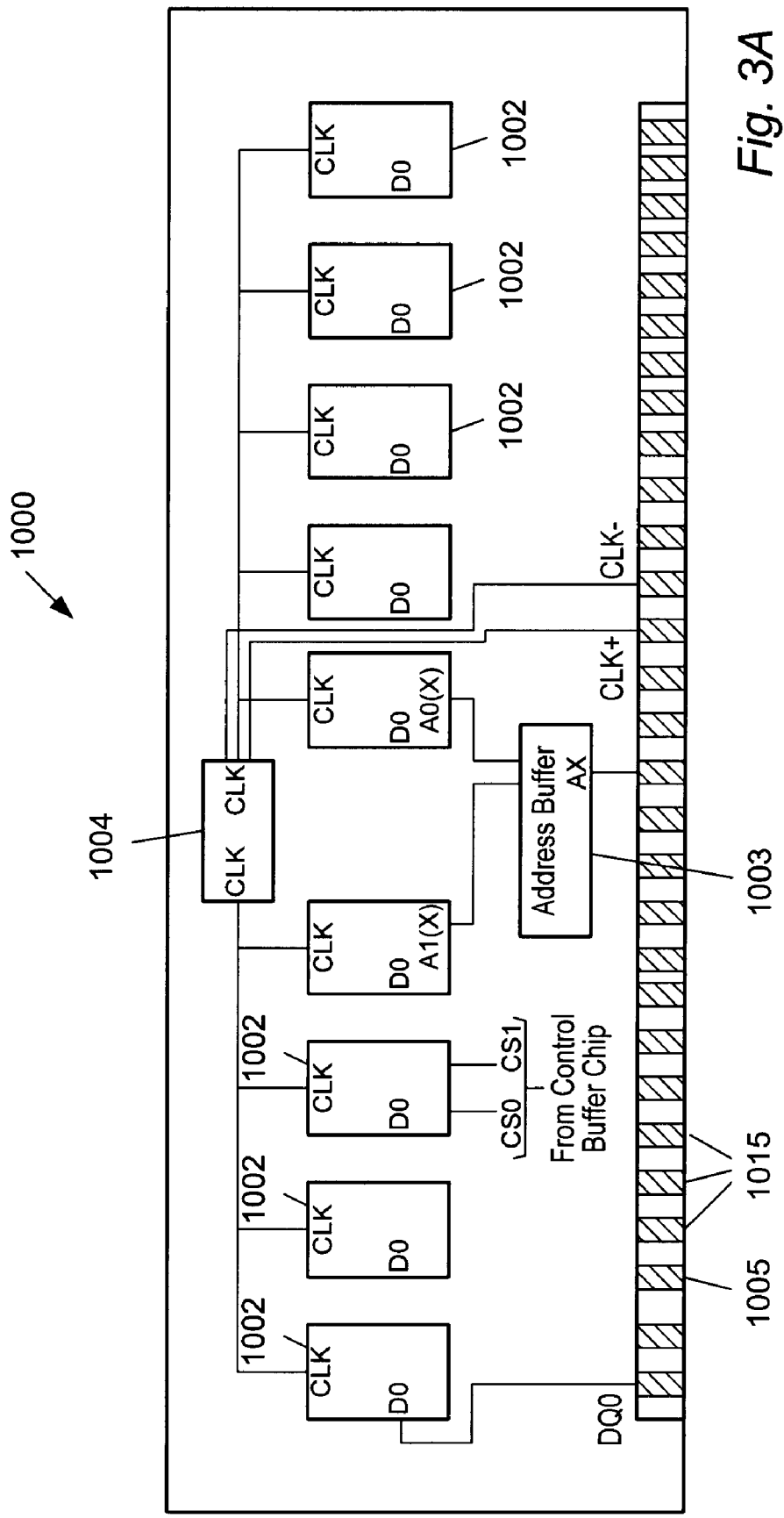
FIG. 3A is a block diagram illustrating the electrical connections associated with the top side of an embodiment of the memory module.
Figure 3B:
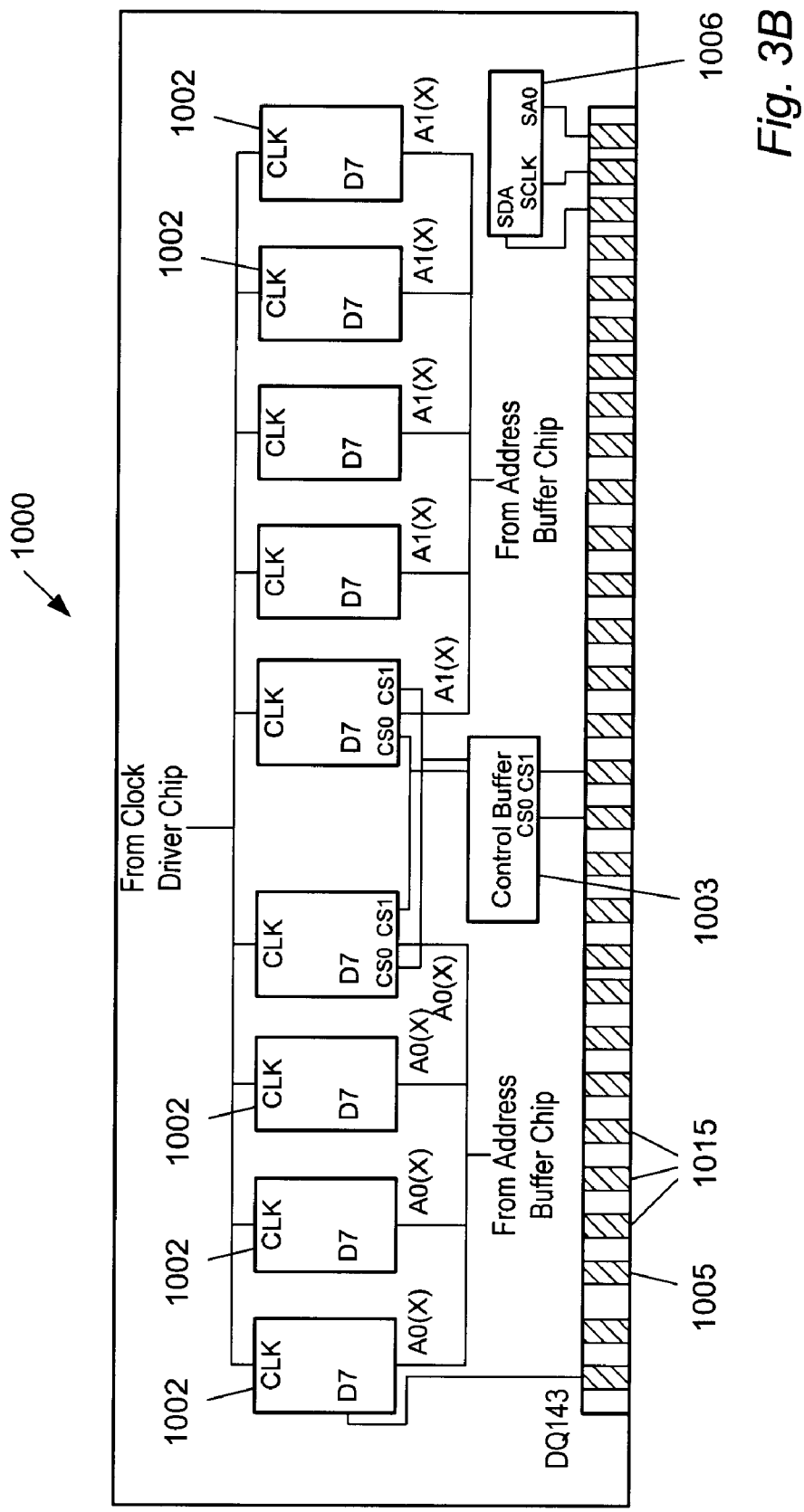
FIG. 3B is a block diagram illustrating the electrical connections associated with the bottom side of an embodiment of the memory module.

FIGS. 3A and 3B are block diagrams illustrating the electrical connections associated with the top and bottom side, respectively, of one embodiment of the memory module. Memory module 1000 includes a plurality of stacked memory packages 1002 mounted upon each side. Memory module 1000 also includes edge connector 1005 for electrically coupling memory module 1000 to the memory bus 104 of FIG. 1. Edge connector 1005 includes a plurality of electrical contacts 1015 for conveying electrical signals between memory module 1000 and the memory bus. As in FIG. 2, a majority of opposing contacts in the embodiment shown are not electrically connected, making the module a DIMM.

On each side of memory module 1000 is mounted a line driver (or buffer) chip 1003. Line driver chip 1003-A in FIG. 3A serves as an address buffer (for address signals), while line driver chip 1003-B in FIG. 3B serves as a control buffer (for control signals). Line driver chip 1003-A is configured to receive address signals from a memory bus of a computer system, via electrical contact pads 1015 and interconnecting signal lines. In the embodiment shown, each address signal is split into two separate signals. Those address signals labeled A0(X) are driven to a first memory bank, while those labeled A1(X) are driven to a second memory bank. Line driver chip 1003-B is configured to receive various control signals from a memory bus. These control signals include chip select signals; CS0 and CS1 as shown. Other control signals (not shown) include row address strobe (RAS), column address strobe (CAS), clock enable (CKE), and write enable (WE).

The top side of the module also includes clock driver chip 1004. Clock driver chip 1004 is configured to receive clock signals from a computer system, and to drive these signals to the memory chips of the stacked memory packages 1002. In the embodiment shown, clock driver chip 1004 actually receives two differential PECL (pseudo emitter coupled logic) level signals, designated here as CLK+ and CLK–. These differential signals are used as inputs to a phase-locked loop (PLL) circuit within the clock driver chip. The output of the PLL is a singular clock signal, which is driven to each of the memory chips within the stacked memory packages 1002. Other embodiments configured to receive a singular clock signal (rather than multiple differential clock signals) are possible and contemplated.

A storage unit 1006 is mounted upon the bottom side of the module. In the embodiment shown, storage unit 1006 is a serial EEPROM (electrically erasable read-only memory). Other embodiments may use a flash memory or other type of device to implement storage unit 1006. In the embodiment shown, storage unit 1006 performs two functions. The first of these functions is module identification, as storage unit 1006 may, in one embodiment, be configured to store a unique serial number for memory module 1000. This serial number may be read by a computer system into which the memory module is inserted. Using the unique serial number, the module history may be traced from its time of manufacture, including any failure information.

The second function of storage unit 1006 is the storage of error correction information. In particular, the storage unit

1006 of the embodiment shown is configured to store information correlating pins of the connector edge to individual pins of stacked memory packages 1002. Using this information, an error detected by an error correction subsystem may be quickly traced to a specific pin of a specific stacked memory package 1002.

Figure 4:
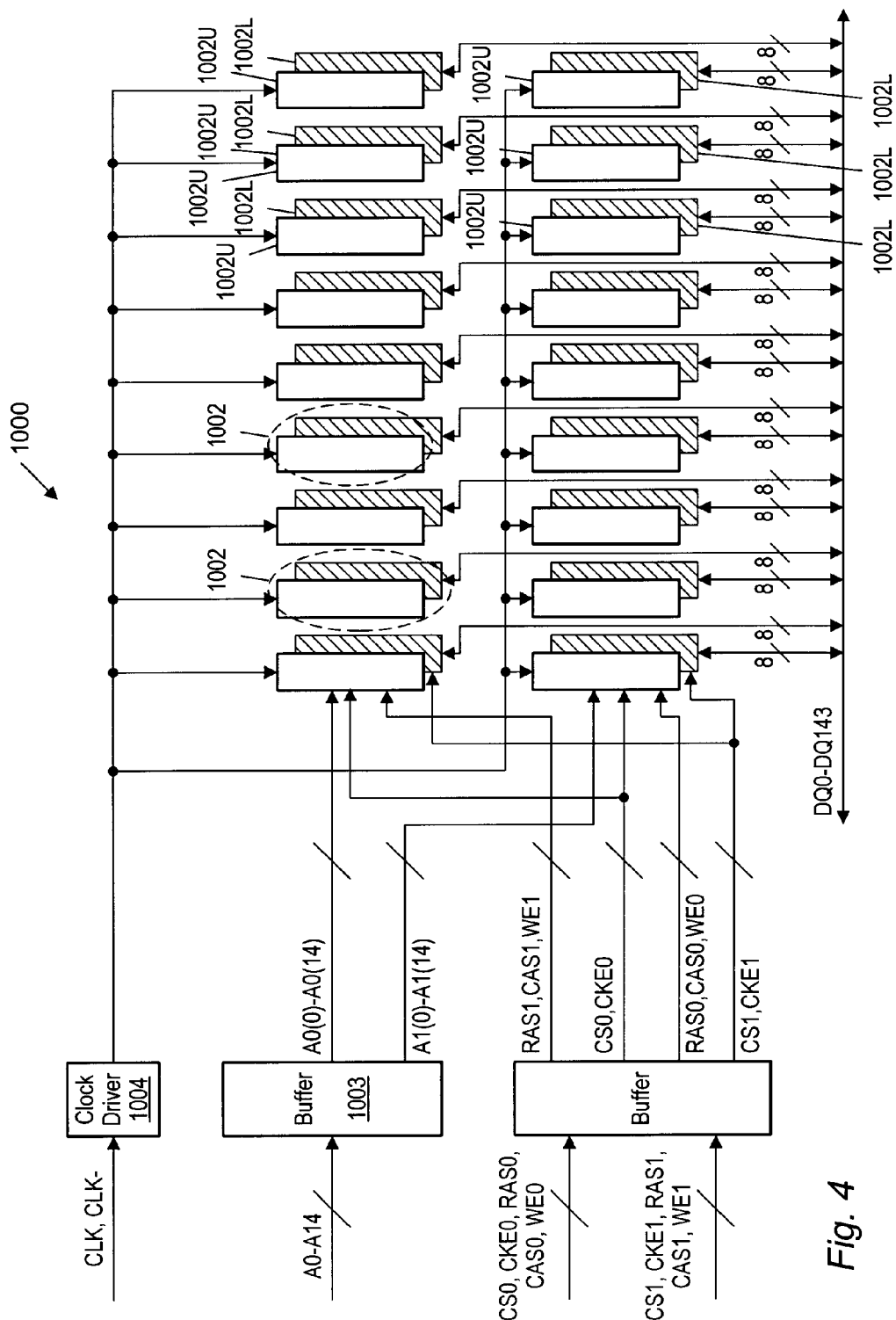
FIG. 4 is a functional block diagram of one embodiment of the memory module.

Turning now to FIG. 4, a functional block diagram of one embodiment of the memory module is shown. Memory module 1000 includes a plurality of memory die1002U and 1002L, wherein each pair of die is part of a stacked memory package 1002 of FIGS. 2 and 3. Typically, memory die 1002U and 1002L will be dynamic random access memory (DRAM) chips. In the embodiment shown, a first bank and a second bank of memory are present. The first bank of memory includes the shown plurality of memory die 1002U, while the second bank includes the shown plurality of memory chips 1002L. Each memory die has a data width of 8 bits, and is coupled to a data bus of 144 bits.

Two buffers, or line driver chips 1003 are used to drive address and control signals to the memory die 1002U and 1002L. One line driver chip 1003 is used exclusively for address signals. Each address signal received by the line driver chip 1003 is duplicated twice and driven to a stacked memory package 1002. A second line driver chip 1003 is used to drive control signals to the memory die 1002U and 1002L within each stacked memory package in order to control the individual banks of memory. Each stacked memory package 1002 is configured to receive a RAS signal (RAS0 or RAS1), a CAS signal (CAS0 or CAS1), and a WE signal (WE0 or WE1). In addition, each stacked memory package 1002 is configured to receive control signals CS0, CS1, CKE0, and CKE1.

Also shown in FIG. 4 is clock driver chip 1004, which is configured to receive two differential PECL clock signals, and drive a singular clock signal to each of the memory chips, as explained above with reference to FIG. 3A.

Figure 5:
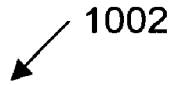
FIG. 5 is a pin diagram of one embodiment of a stacked memory package.

FIG. 5 is a pin diagram of one embodiment of a stacked memory package 1002. In the embodiment shown, stacked memory package 1002 includes two memory die. Each stacked memory package is configured to receive 8 data signals (DQ0–DQ7), 15 address signals (A0–A12 and BA0–BA1), and control signals CS0, CS1, CKE0, CKE1, RAS, CAS, and WE. Address signals BA0 and BA1 correspond to address signals A13 and A14 as shown in FIG. 4. In general, a limitation of two memory die per stacked memory package is placed upon the various embodiments of the memory module, due to considerations for power consumption and thermal output of the module. Stacked packages with only two memory die may consume less power and generate less heat than those containing three or more memory die, while still allowing additional memory capacity without the need for additional circuit area relative to memory packages having a single memory die.

Figure 6:
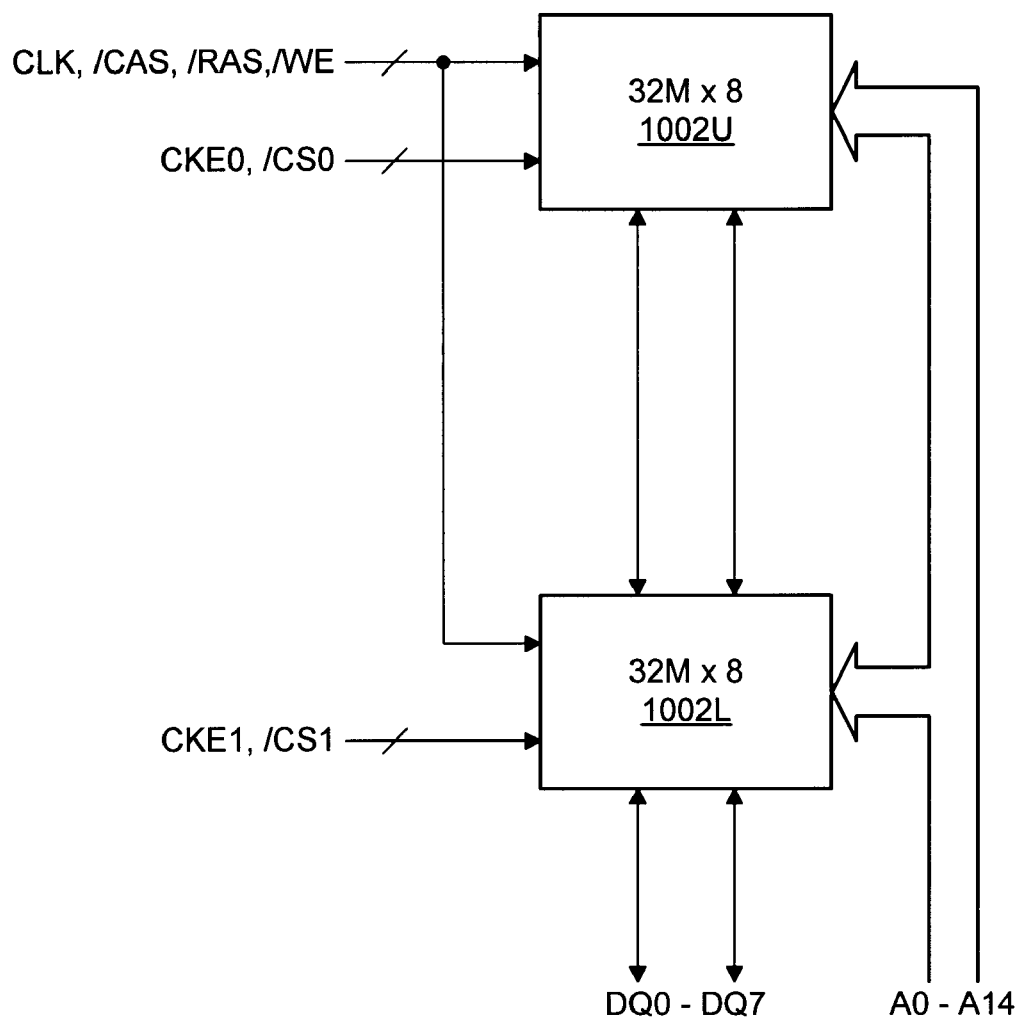
FIG. 6 is a block diagram of the internal organization of one embodiment of a stacked memory package.

FIG. 6 is a block diagram of the internal organization of one embodiment of a stacked memory package. The embodiment shown consists of memory die 1002U and 1002L. Address signals A0–A14 are coupled to both memory die, as are control signals CAS, RAS, and WE, and data signals DQ0–DQ7. A clock signal, CLK, is also coupled to both memory die. Control signals CKE0 and CS0 are coupled to memory die 1002U, and are asserted during read and write operations to this memory die. Likewise, control signals CKE1 and CS1 are coupled to memory die 1002L. Memory die 1002U and 1002L are part of a first and a second memory bank, respectively. The memory die in this embodiment are 32M×8 (i.e. 32 megabytes) each, resulting in a stacked memory package with a capacity of 64 megabytes. Using a total of 18 stacked memory packages of this capacity results in a module capacity of one gigabyte.

Figure 7:
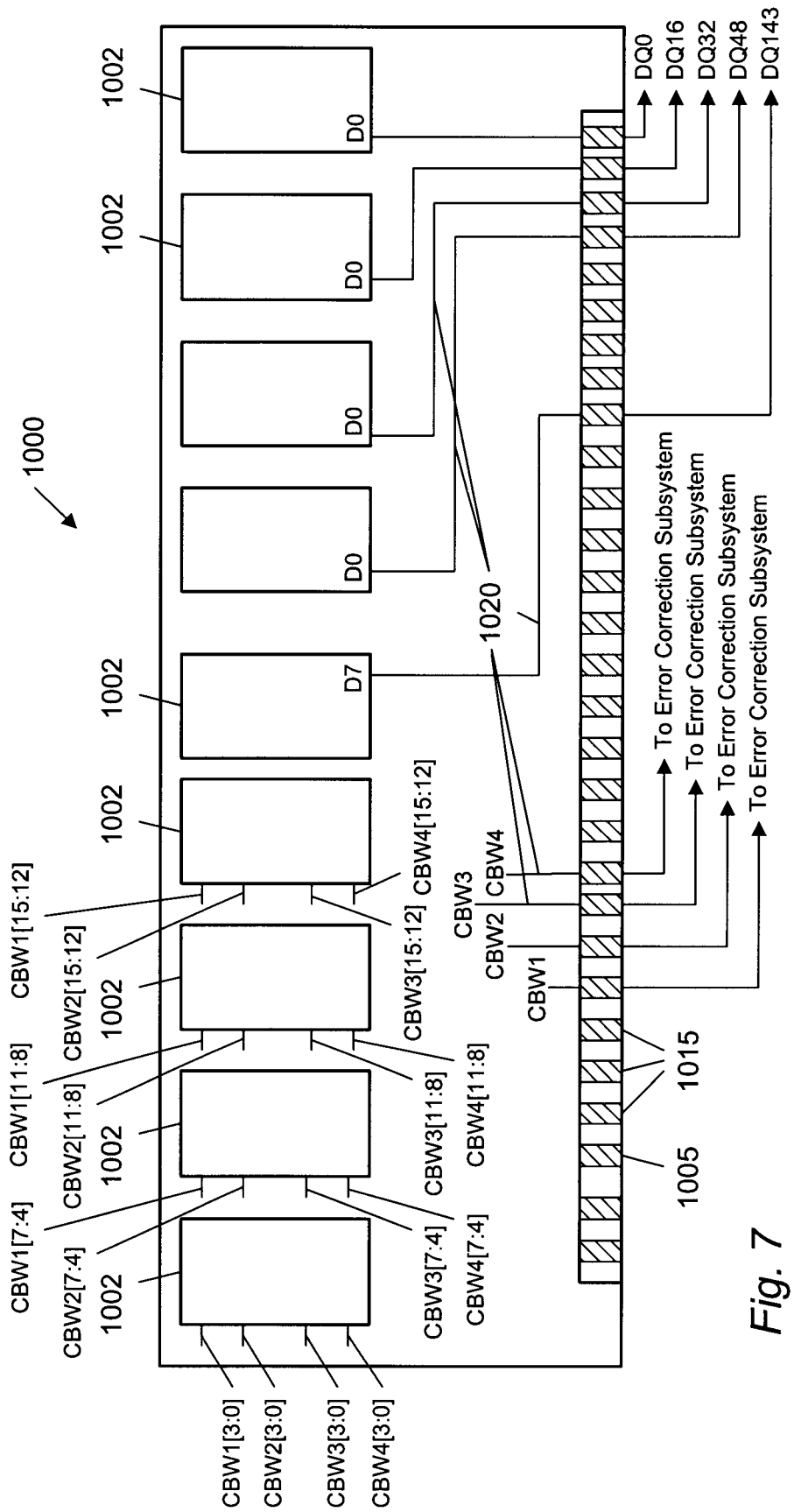
FIG. 7 is a drawing of one embodiment the memory module illustrating the electrical interconnections associated with error correction functions; and, FIG. 8 is a table illustrating exemplary entries within the storage unit correlating connector pins to integrated circuit pins.

FIG. 7 is a drawing of one embodiment the memory module illustrating the electrical interconnections associated with error correction functions. Memory module 1000 includes a printed circuit board upon which stacked memory packages 1002 are mounted. Each of these packages has a data width of 8 bits, and includes two memory chips (1002U and 1002L from FIGS. 4 and 6). Depending on the organization of memory module 1000, some of these memory die may be used to store error correction check bits, while others may be used to store data bits. Memory module 1000 also includes an edge connector 1005, with a plurality of electrical contact pads 1015. A plurality of signal lines 1020 couples the electrical contact pads 1015 to the stacked memory packages 1002. Data signals are conveyed along signal lines 1020 between the stacked memory packages 1002 and electrical contact pads 1015. Data pin D0 of each stacked memory package 1002 is shown coupled to electrical contact pads 1015 by signal lines 1020, with the respective position of the bit in the data word (i.e. DQ0, DQ16, etc.) shown. The most significant bit of the data, DQ143, is coupled to pin D7 of a stacked memory package 1002. In this embodiment, 16 check bits are used to protect each data block of 128 bits, with each check word associated with one data block only.

As previously stated, some memory die of the stacked memory packages 1002 may be used exclusively to store check bits in this embodiment. Each of these memory die may store four check bits of each check word. In the embodiment shown, each check word is 16 bits, and protects a data block of 128 bits. These check bits are accessed through a plurality of pins designated CBWX[y:z]. For example, CBW1[3:0] shown in the drawing represents four pins of a stacked memory package 1002 through which check bits 0 through 3 of check word #1 are accessed. Similarly, CBW2[7:4] represents those pins through which check bits 4 through 7 of check word #2 are accessed. Each of these pins is connected to a respective signal line. Representative signal lines are shown in the drawing as CBW1 through CBW4. In general, these signal lines are routed on the printed circuit board in such a manner that physically adjacent memory cells within each memory die store check bits corresponding to different check words.

FIG. 8 is a table illustrating exemplary entries within the storage unit correlating connector pins to integrated circuit pins. In the table shown, each connector pad of an edge connector (such as edge connector 1005 of FIGS. 3A and 3B) is associated with a pin of an integrated circuit package (such as the stacked memory packages 1002 of FIGS. 3A and 3B). For example, connector pad #1 is associated with integrated circuit U1, pin 5 (U1.5). Similarly, connector pad #5 is associated with integrated circuit U1, pin 9. Most if not all connector pads may be associated with at least one pin of one integrated circuit. In many cases, certain connector pads may be associated with a plurality of integrated circuit pins. Such connector pads may include those that carry address signals and enable signals (e.g. chip enable and write enable signals).

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A memory module comprising:
   a printed circuit board including a connector edge adapted for insertion within a socket of a computer system, wherein said connector edge includes a plurality of electrical contact pads for conveying electrical signals;
   a plurality of stacked memory packages mounted upon said printed circuit board, each of said stacked memory packages including a first memory die and a second memory die, and wherein said first memory die of each of said stacked memory packages forms a portion of a first bank of memory and said second memory die of each of said stacked memory packages forms a portion of a second bank of memory;
   a clock driver chip;
   a serial storage unit, wherein said serial storage unit stores module identification information and signal line routing information which correlates each of at least some of said contact pads of said connector edge to a corresponding pin of a particular stacked memory package; and,
   at least one line driver chip configured to drive control signals and/or address signals.

2. The memory module as recited in claim 1, wherein said edge connector has 232 of said electrical contact pads.

3. The memory module as recited in claim 1, wherein said connector edge includes contact pads for receiving control signals, said control signals comprising at least one row address strobe (RAS) signal, at least one column address strobe (CAS) signal, at least one write enable (WE) signal, at least one clock enable (CKE) signal, and a least one chip select (CS) signal.

4. The memory module as recited in claim 1, wherein said electrical signals include a plurality of address signals, and wherein said plurality of address signals form an address bus.

5. The memory module as recited in claim 4, wherein said address bus is 14 bits wide.

6. The memory module as recited in claim 1, wherein said electrical signals include a plurality of data signals, and wherein said plurality of data signals form a data path.

7. The memory module as recited in claim 6, wherein said data path is 144 bits wide.

8. The memory module as recited in claim 1, wherein said memory module is configured for use in a system having an error correction subsystem, said error correction subsystem configured to generate a plurality of check words corresponding to a plurality of data blocks.

9. The memory module as recited in claim 1, wherein said serial storage unit is a serial electrically erasable programmable read-only memory (EEPROM).

10. The memory module as recited in claim 1, wherein said first memory die and said second memory die are dynamic random access memory (DRAM) chips.

11. The memory module as recited in claim 1, wherein said memory module is a dual-inline memory module (DIMM).

12. The memory module as recited in claim 1, wherein said memory module has a memory capacity of one gigabyte.

13. The memory module as recited in claim 1, wherein each of said stacked memory packages includes two memory die.

14. A memory module comprising:
    a printed circuit board including a plurality of signal lines for conveying electrical signals and a connector edge adapted for insertion within a socket of a computer system, said edge connector having a plurality of contact pads for conveying said electrical signals between said memory module and a memory bus;
    a plurality of stacked memory packages, each having two memory die, mounted upon said printed circuit board, each of said stacked memory packages having a plurality of signal pins;
    a clock driver chip;
    a storage unit for storing module identification and information which correlates said electrical contact pads to said signal pins; and,
    at least one line driver chip for driving electrical signals to said stacked memory packages.

15. The memory module as recited in claim 14, wherein said electrical signals include a plurality of control signals, a plurality of data signals, and a plurality of address signals.

16. The memory module as recited in claim 15, wherein said plurality of data signals form a data path, said data path 144 bits wide.

17. The memory module as recited in claim 15, wherein said plurality of address signals form an address bus, said address bus 14 bits wide.

18. The memory module as recited in claim 15, wherein said control signals include two column address strobe (CAS) signals, two row address strobe (RAS) signals, two write enable (WE) signals, two chip select (CS) signals, and two clock enable (CKE) signals.

19. The memory module as recited in claim 14, wherein said memory module is a Dual Inline Memory Module (DIMM).

20. The memory module as recited in claim 14, wherein said memory die are synchronous dynamic random access memory (SDRAM) chips.

21. The memory module as recited in claim 14 wherein said memory module has 232 of said contact pads.

* * * * *